United States Patent
Fujieda et al.

(10) Patent No.: US 6,191,999 B1
(45) Date of Patent: *Feb. 20, 2001

(54) SEMICONDUCTOR MEMORY DEVICE WITH REDUCED POWER CONSUMPTION

(75) Inventors: Waichirou Fujieda; Shinya Fujioka; Tadao Aikawa, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/993,139

(22) Filed: Dec. 18, 1997

(30) Foreign Application Priority Data

Jun. 20, 1997 (JP) .................................................. 9-164618
Jun. 20, 1997 (JP) .................................................. 9-164619

(51) Int. Cl.$^7$ ..................................................... G11C 8/00
(52) U.S. Cl. ............................. 365/230.06; 365/230.03; 365/51
(58) Field of Search .................... 365/230.06, 230.03, 365/207, 4, 230.08, 208, 193

(56) References Cited

U.S. PATENT DOCUMENTS

| | | | | |
|---|---|---|---|---|
| 5,596,542 | * | 1/1997 | Sugibayashi et al. | 365/230.06 |
| 5,696,727 | * | 12/1997 | Tsukude et al. | 365/208 |
| 5,808,955 | * | 9/1998 | Hwang et al. | 365/230.06 |
| 5,818,786 | * | 10/1998 | Yoneda | 365/230.03 |

* cited by examiner

Primary Examiner—David Nelms
Assistant Examiner—Thong Le
(74) Attorney, Agent, or Firm—Arent Fox Kintner Plotkin & Kahn

(57) ABSTRACT

A semiconductor memory device using hierarchical word decoding for word selection includes memory-cell areas, each of which is provided for a corresponding one of column blocks. The semiconductor memory device further includes sub-word lines provided for each one of the column blocks and extending over a corresponding one of the memory-cell areas, and sub-word decoders provided on either side of a given one of the memory-cell areas to select one of the sub-word lines only with respect to the given one of the memory-cell areas.

27 Claims, 14 Drawing Sheets

SEMICONDUCTOR MEMORY DEVICE WITH REDUCED POWER CONSUMPTION

BACKGROUND OF THE INVENTION

1. Field of the Invention

The present invention generally relates to semiconductor memory devices, and particularly relates to a semiconductor memory device which employs a hierarchical word-decode scheme.

2. Description of the Related Art

The hierarchical word-decode scheme employs a hierarchical structure of word lines in which two types of word lines, i.e., main-word lines and sub-word lines, are used for word selection. A typical material used for word lines is polysilicon. Unfortunately, polysilicon has a relatively high resistance for a wiring material, causing a significant delay to signals propagating therethrough. A conventional technique to counter this is to establish a contact at predetermined intervals between polysilicon word lines and aluminum wiring lines arranged in parallel to the polysilicon word lines, thereby reducing a resistance of the word lines. In order to increase circuit density, however, intervals between the wiring lines needs to be shortened, but it is difficult to implement a pattern of aluminum wiring lines having the same pitch as polysilicon wiring lines. The hierarchical word-decode scheme obviates this problem by dividing polysilicon word lines into sub-word lines having tolerable delays and by using aluminum for main-word lines to achieve sufficiently small delays.

FIG. 1 is an illustrative drawing showing a word-line structure according to a related-art hierarchical word-decode scheme. A main-word decoder 201 decodes a row address to select one of main-word lines 208, and turns the selected main-word line to HIGH. The main-word lines 208 are provided on a wiring layer. In a different wiring layer, four sub-word lines 209 are laid out generally under the main-word lines 208. The sub-word lines 209 are connected to four types of sub-word decoders 204 through 207, respectively. The sub-word decoders of the same type are arranged in a row perpendicular to the extension of the main-word lines 208.

A sub-word-decoder selecting circuit 202 selects one type of sub-word decoder among the four types of the sub-word decoders 204 through 207 via the sub-word-decoder selection lines 210. The selected type of the sub-word decoders connects the main-word lines 208 to the sub-word lines 209. As a result, only one of the four sub-word lines 209 connected to the selected one of the main-word lines 208 becomes HIGH when this sub-word line 209 is selected by the sub-word-decoder selecting circuit 202. This achieves a hierarchical word selection. In the case of data-read operations, for example, data stored in memory cells (not shown) is read by sense amplifiers of sense-amplifier blocks 203 only with respect to the selected word.

The sub-word decoders 204 through 207 are provided on a wiring layer different from the wiring layer of the sub-word lines 209 laid out over the memory cells. In such a configuration, the sub-word decoders 204 through 207 are connected to the respective sub-word lines 209 via contacts 211.

It is desirable to reduce power consumption in semiconductor memory devices, and such an effort should be directed to every minute detail. To this end, sense amplifiers may be driven only with respect to a column block at a particular column address by reading the column address prior to carrying out a row-access operation. Namely, in the example of FIG. 1, only one of the sense-amplifier blocks 203 may be driven when this has an indicated column address, rather than driving all the sense-amplifier blocks 203.

In order to drive only one of the sense-amplifier blocks 203 with respect to a particular column block, a data-read operation for memory cells should be carried out only with respect to the same column block. If data is read from memory cells in all the column blocks and only one of the sense-amplifier blocks 203 is driven, some of the data is not held by the sense amplifiers since some of the sense-amplifier blocks 203 are not in operation. Such data that are not held by the sense amplifiers fail to be restored in the memory cells. As a result, data of the memory cells are destroyed in column blocks other than the column block where the sense-amplifier block 203 is operated.

In the configuration of FIG. 1, each of the sub-word lines 209 extends on either side of a corresponding one of the sub-word decoders 204 through 207, and is shared by the two column blocks on either side. If a sub-word decoder is selected only with respect to a selected column block, selection of one of the sub-word lines 209 results in data being read from the memory cells with respect to two column blocks on either side of the selected sub-word decoder. If only one of the sense-amplifier blocks 203 is driven as previously described, data destruction is bound to happen in a column block where a sense-amplifier block is not operated.

To avoid this, sub-word decoders may be provided with respect to each column block. FIG. 2 is an illustrative drawing showing another word-line structure according to the related-art hierarchical word-decode scheme.

FIG. 2 shows main-word lines and sub-word lines and relevant portions surrounding these word lines, and irrelevant portions are omitted from the figure. As shown in FIG. 2, the sub-word lines 209 extends only on one side of the sub-word decoders 204 through 207 within a span of a single column block. In this configuration, a word-selection operation can be performed only in one column block by selecting a sub-word decoder with respect to only one column block. This prevents data destruction of memory cells as previously described.

There is a reason, however, as to why the configuration of FIG. 1 is typically used instead of the configuration of FIG. 2. This issue relates to a chip size. In the configuration of FIG. 2, four contacts 211 need to be arranged in a row for each one of the main-word lines 208. The contacts 211, however, cannot be arranged so close to each other. Intervals between the sub-word lines 209 are thus bound to be wider in the configuration of FIG. 2 than in the configuration of FIG. 1, resulting in a chip size being increased in a vertical direction of the figure.

Further, the configuration of FIG. 2 has a complete set of sub-word decoders for each column block. This means double the number of sub-word decoders compared to the configuration of FIG. 1. Chip size in a horizontal direction of the figure is also enlarged.

Accordingly, there is a need for a semiconductor memory device in which a complete set of sub-word decoders is provided for each column block without enlarging a chip size.

SUMMARY OF THE INVENTION

Accordingly, it is a general object of the present invention to provide a semiconductor memory device which can satisfy the need described above.

Also, it is another and more specific object of the present invention to provide a semiconductor memory device in which a complete set of sub-word decoders is provided for each column block without enlarging a chip size.

In order to achieve the above object according to the present invention, a semiconductor memory device using hierarchical word decoding for word selection includes memory-cell areas, each of which is provided for a corresponding one of column blocks. The semiconductor memory device further includes sub-word lines provided for each one of the column blocks and extending over a corresponding one of the memory-cell areas, and sub-word decoders provided on either side of a given one of the memory-cell areas to select one of the sub-word lines only with respect to the given one of the memory-cell areas.

In the semiconductor memory device described above, the sub-word decoders are provided on either side of a memory-cell area with respect to each column block, so that the number of contacts arranged in a line perpendicular to the extension of the word lines can be small, thereby avoiding a chip-size enlargement in a direction perpendicular to the extension of the word lines.

According to one aspect of the present invention, the semiconductor memory device is such that the sub-word lines are selected and activated only with respect to a selected one of the column blocks.

In the semiconductor memory device described above, since the sub-word lines are selected and activated only with respect to a selected column block, data is accessed only with respect to the selected column block.

According to another aspect of the present invention, the semiconductor memory device further includes sense-amplifier blocks, each of which is provided for a corresponding one of the column blocks, wherein only one of the sense-amplifier blocks is driven with respect to the selected one of the column blocks.

In the semiconductor memory device described above, since sense amplifiers are driven only with respect to the selected column block, an excessive power consumption can be avoided. Further, since data is accessed only in the selected column block, data destruction in other column blocks can be prevented.

According to another aspect of the present invention, the semiconductor memory device is such that every other one of the sub-word lines is connected to the sub-word decoders provided on a first side of the given one of the memory-cell areas, and remaining ones of the sub-word lines are connected to the sub-word decoders provided on a second side of the given one of the memory-cell areas.

In the semiconductor memory device described above, the number of contacts arranged in a line perpendicular to the extension of the word lines is relatively small, thereby avoiding a chip-size enlargement in a direction perpendicular to the extension of the word lines.

According to another aspect of the present invention, the semiconductor memory device is such that every other pair of the sub-word lines is connected to the sub-word decoders provided on a first side of the given one of the memory-cell areas, remaining pairs of the sub-word lines are connected to the sub-word decoders provided on a second side of the given one of the memory-cell areas.

In the semiconductor memory device described above, the number of contacts arranged in a line perpendicular to the extension of the word lines is relatively small, thereby avoiding a chip-size enlargement in a direction perpendicular to the extension of the word lines.

According to another aspect of the present invention, the semiconductor memory device is such that each of the sub-word decoders includes an NMOS transistor, a PMOS transistor, and a first substrate area where the NMOS transistor is formed, and the first substrate area of a given one of the sub-word decoders is situated alongside the first substrate area of an adjacent one of the sub-word decoders.

In the semiconductor memory device described above, N-channel-transistor areas are situated alongside between adjacent sub-word decoders, thereby avoiding a chip-size enlargement in a direction of the extension of the word lines.

According to another aspect of the present invention, the semiconductor memory device is such that each of the sub-word decoders includes an NMOS transistor, a PMOS transistor, and a second substrate area where the PMOS transistor is formed, and the second substrate area of a given one of the sub-word decoders is situated alongside the second substrate area of an adjacent one of the sub-word decoders.

In the semiconductor memory device described above, P-channel-transistor areas are situated alongside between adjacent sub-word decoders, thereby avoiding a chip-size enlargement in a direction of the extension of the word lines.

According to another aspect of the present invention, a semiconductor memory device includes a plurality of main-word lines, a main-word decoder selecting one of the plurality of main-word lines, memory-cell areas each provided for a corresponding one of column blocks, sub-word lines provided for each one of the column blocks and extending over a corresponding one of the memory-cell areas, and sub-word decoders provided on either side of a given one of the memory-cell areas to select one of the sub-word lines only with respect to the given one of the memory-cell areas.

In the semiconductor memory device described above, the sub-word decoders are provided on either side of a memory-cell area with respect to each column block, so that the number of contacts arranged in a line perpendicular to the extension of the word lines can be small, thereby avoiding a chip-size enlargement in a direction perpendicular to the extension of the word lines.

According to another aspect of the present invention, the semiconductor memory device is such that the sub-word liens are selected and activated only with respect to a selected one of the column blocks.

In the semiconductor memory device described above, since the sub-word liens are selected and activated only with respect to a selected column block, data is accessed only with respect to the selected column block.

According to another aspect of the present invention, the semiconductor memory device further includes sense-amplifier blocks, each of which is provided for a corresponding one of the column blocks, wherein only one of the sense-amplifier blocks is driven with respect to the selected one of the column blocks.

In the semiconductor memory device described above, since sense amplifiers are driven only with respect to the selected column block, an excessive power consumption can be avoided. Further, since data is accessed only in the selected column block, data destruction in other column blocks can be prevented.

According to another aspect of the present invention, the semiconductor memory device is such that each of the sub-word decoders includes an NMOS transistor, a PMOS transistor, and a first substrate area where the NMOS transistor is formed, and the first substrate area of a given one of the sub-word decoders is situated alongside the first substrate area of an adjacent one of the sub-word decoders.

In the semiconductor memory device described above, N-channel-transistor areas are situated alongside between adjacent sub-word decoders, thereby avoiding a chip-size enlargement in a direction of the extension of the word lines.

According to another aspect of the present invention, the semiconductor memory device is such that each of the sub-word decoders includes an NMOS transistor, a PMOS transistor, and a second substrate area where the PMOS transistor is formed, and the second substrate area of a given one of the sub-word decoders is situated alongside the second substrate area of an adjacent one of the sub-word decoders.

In the semiconductor memory device described above, P-channel-transistor areas are situated alongside between adjacent sub-word decoders, thereby avoiding a chip-size enlargement in a direction of the extension of the word lines.

According to another aspect of the present invention, a semiconductor memory device using hierarchical word decoding for word selection includes memory-cell areas each provided for a corresponding one of column blocks, and sub-word decoders provided on either side of a given one of the memory-cell areas to select one of sub-word lines only with respect to the given one of the memory-cell areas.

In the semiconductor memory device described above, the sub-word decoders are provided on either side of a memory-cell area with respect to each column block, so that the number of contacts arranged in a line perpendicular to the extension of the word lines can be small, thereby avoiding a chip-size enlargement in a direction perpendicular to the extension of the word lines.

According to another aspect of the present invention, the semiconductor memory device is such that each of the sub-word decoders includes an NMOS transistor, a PMOS transistor, a first substrate area where the NMOS transistor is formed, and a second substrate area where the PMOS transistor is formed, and the first substrate area of a given one of the sub-word decoders is situated alongside the first substrate area of an adjacent one of the sub-word decoders, the second substrate area of a given one of the sub-word decoders is situated alongside the second substrate area of an adjacent one of the sub-word decoders.

In the semiconductor memory device described above, either of the N-channel-transistor areas and P-channel-transistor areas are situated alongside between adjacent sub-word decoders, thereby avoiding a chip-size enlargement in a direction of the extension of the word lines.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3:
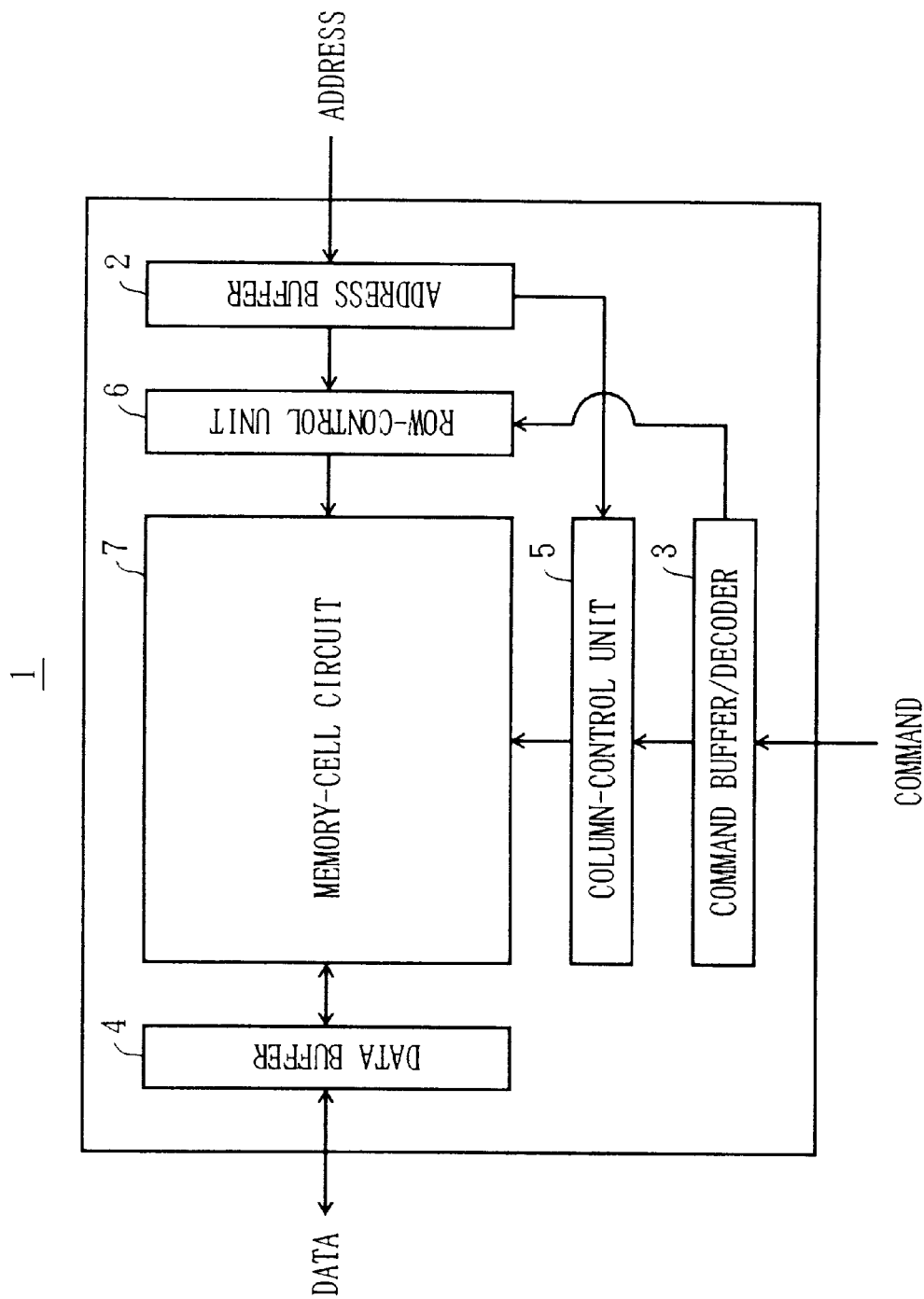
FIG. 3 is a block diagram of a semiconductor memory device having a configuration of sub-word decoders according to the present invention.

FIG. 3 is a block diagram of a semiconductor memory device having a configuration of sub-word decoders according to the present invention.

A semiconductor memory device 1 of FIG. 3 includes an address buffer 2, a command buffer/decoder 3, a data buffer 4, a column-control unit 5, a row-control unit 6, and a memory-cell circuit 7.

The address buffer 2 receives an address input, and supplies a row address and a column address to the row-control unit 6 and the column-control unit 5, respectively. The command buffer/decoder 3 receives a command input, and decodes the contents of the command input. Based on the decoding results of the command buffer/decoder 3, the column-control unit 5 and the row-control unit 6 are controlled. The memory-cell circuit 7 includes a memory-cell array, main-word lines, sub-word lines, bit lines, sense amplifiers, etc.

The row-control unit 6 selects and activates a main-word line and a sub-word line corresponding to an indicated row address to effect a data exchange between corresponding memory cells and sense amplifiers. In the semiconductor memory device 1, a column address is already available when the row-control unit 6 performs a row-address access. By referring to this column address, the column-control unit 5 selects a column block corresponding to the indicated column address, so that the row-address access is performed only in the selected column block. Namely, sense amplifiers are driven and sub-word lines are activated by the row-control unit 6 only within the selected column block.

The column-control unit 5 accesses the indicated column address in the selected column block. This achieves a data exchange between the data buffer 4 and a sense amplifier of the indicated column address. The data buffer 4 receives data from outside of the semiconductor memory device 1 to supply the data to the memory-cell circuit 7, or receives data from the memory-cell circuit 7 to supply the data to outside of the semiconductor memory device 1.

Figure 4:
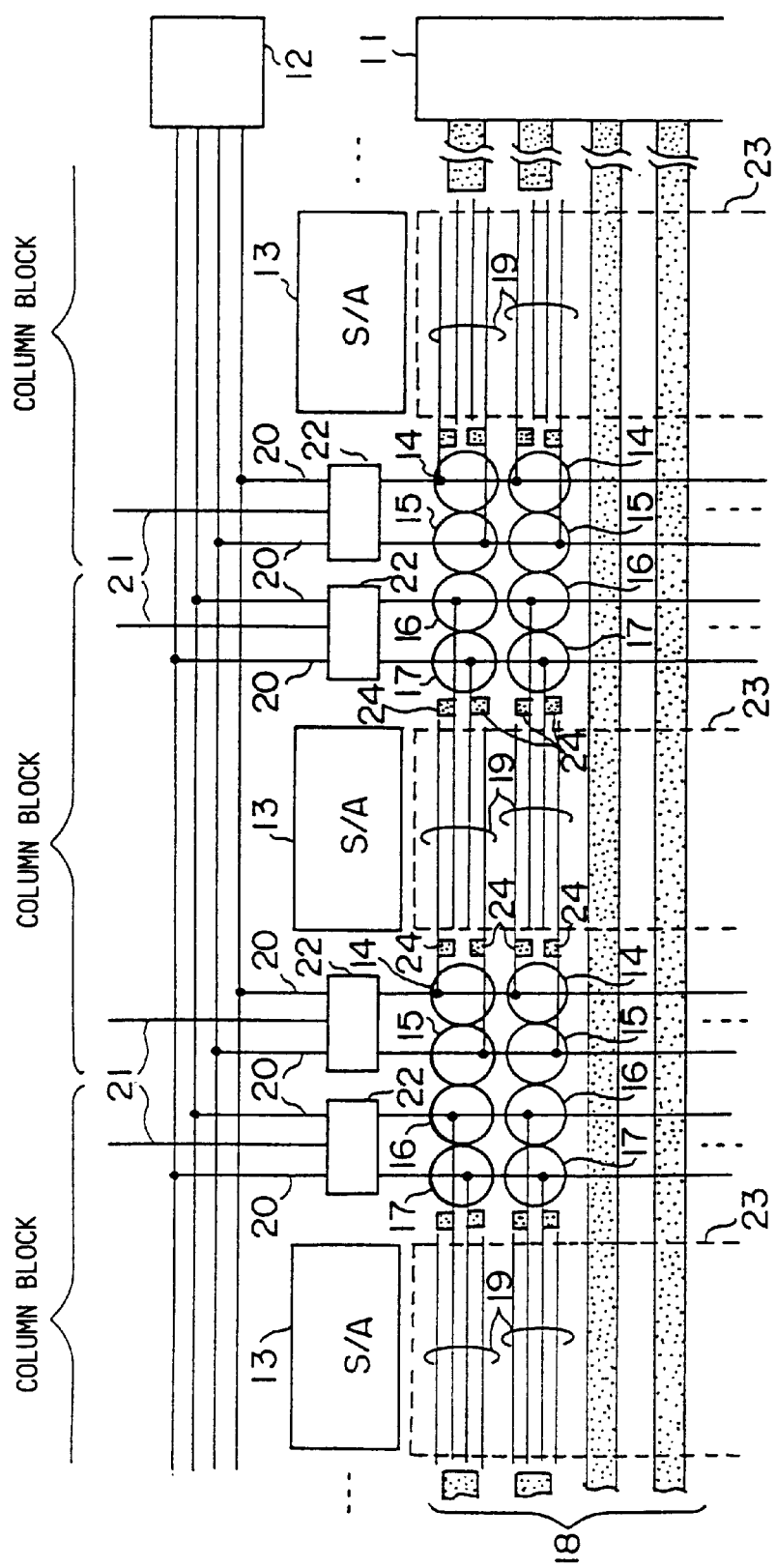
FIG. 4 is an illustrative drawing showing a configuration of sub-word decoders according to the present invention.

FIG. 4 is an illustrative drawing showing a configuration of sub-word decoders according to the present invention. FIG. 4 shows a relevant portion of the row-control unit 6 and the memory-cell circuit 7 shown in FIG. 3.

A main-word decoder 11 decodes a row address to select one of the main-word lines 18, and turns the selected main-word line to HIGH. The main-word lines 18 are provided on a wiring layer. In a different wiring layer, four sub-word lines 19 are laid out generally under the main-word lines 18. The sub-word lines 19 are connected to four types of sub-word decoders 14 through 17, respectively. The sub-word decoders of the same type are arranged in a row perpendicular to the extension of the main-word lines 18.

A set of the sub-word decoders 14 through 17 is provided with respect to each of sense-amplifier blocks 13. That is, a set of the sub-word decoders 14 through 17 is provided for each column block. Sub-word lines 19 extend from the sub-word decoders 14 through 17 on one side thereof, and perform word selection with respect to a corresponding column block.

A sub-word-decoder selecting circuit 12 transmits a signal for selecting one type of sub-word decoders from the four types of the sub-word decoders 14 through 17 to the sub-word-decoder selection lines 20. Column-block selection lines 21 convey a signal for indicating a selected column block to sub-word-decoder controlling circuits 22. In the selected column block, a corresponding one of the sub-word-decoder controlling circuits 22 supplies the signal from the sub-word-decoder selecting circuit 12 to the sub-word decoders 14 through 17.

The selected type of the sub-word decoders connects the main-word lines 18 to the sub-word lines 19. As a result, only one of the four sub-word lines 19 connected to the selected one of the main-word lines 18 becomes HIGH only in the selected column block when this sub-word line 19 is selected by the sub-word-decoder selecting circuit 12. This achieves a hierarchical word selection.

In the case of data-read operations, for example, data stored in memory cells (not shown) corresponding to the selected word is read from a memory-cell area 23 of the selected column block, and is held by sense amplifiers of a corresponding one of the sense-amplifier blocks 13. Here, only one of the sense-amplifier blocks 13 is driven with respect to the selected column block.

The sub-word decoders 14 through 17 of a given column block are arranged on either side of the memory-cell area 23 in the given column block. In the example of FIG. 4, two of the four sub-word lines 19 in a given column block are connected to the sub-word decoders 16 and 17 provided on the right-hand side of the memory-cell area 23, and the remaining two of the sub-word lines 19 are connected to the sub-word decoders 14 and 15 arranged on the left-hand side of the memory-cell area 23.

In this configuration, the number of contacts 24 arranged in a line perpendicular to the extension of the main-word lines 18 is half the number of the sub-word lines 19. In the example of FIG. 4, four sub-word lines 19 are provided for each one of the main-word lines 18, so that only two contacts 24 in one line are necessary for each one of the main-word lines 18. Because of this, despite a configuration in which a complete set of the sub-word decoders 14 through 17 are provided for each column block, the present invention requires as small a number of contacts as the configuration of FIG. 1 in which two adjacent column blocks share the sub-word decoders.

In this manner, the present invention arranges a complete set of the sub-word decoders for each column block on either side of the memory-cell area such that the sub-word lines extend from the sub-word decoders over the memory-cell area. This configuration achieves the word-selection control with respect to each column block, and, at the same time, can reduce the number of contacts arranged in a line perpendicular to the word lines, thereby avoiding an enlargement of chip size in a direction perpendicular to the word lines.

Figure 5:
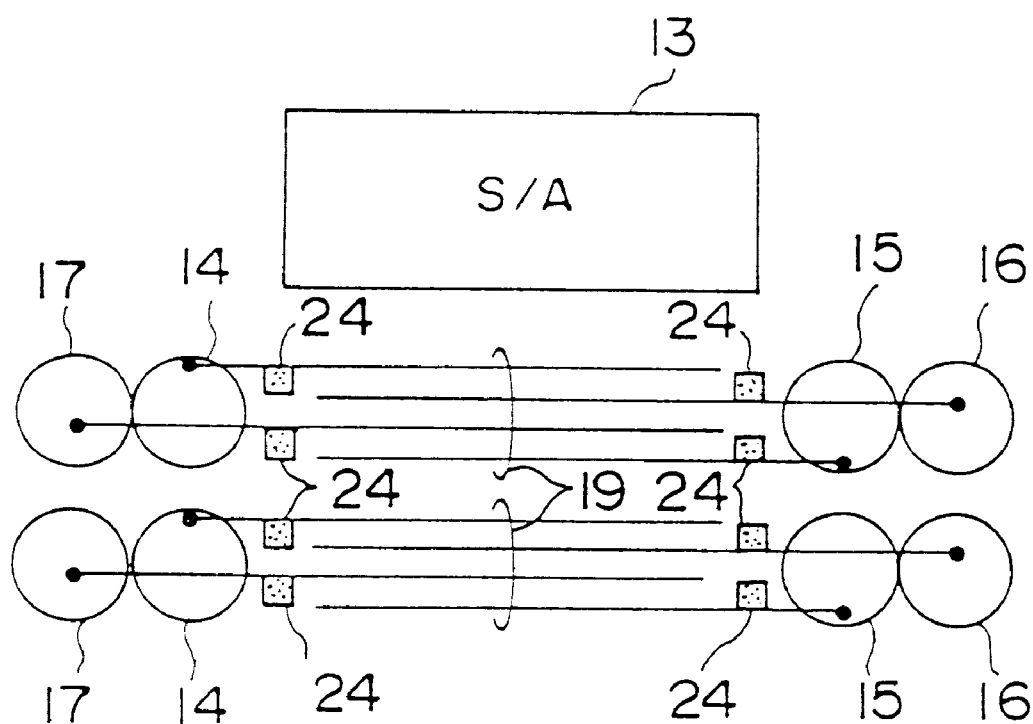
FIG. 5 is an illustrative drawing showing a configuration in which every other one of sub-word lines is connected to the sub-word decoders provided on the same side.

In FIG. 4, every other pair of sub-word lines 19 is connected to the sub-word decoders provided on the same side of the memory-cell area 23. Alternately, every other sub-word line may be connected to the sub-word decoders provided on the same side of the memory-cell area 23. FIG. 5 is an illustrative drawing showing a configuration in which every other one of the sub-word lines 19 is connected to the sub-word decoders provided on the same side.

As noted in the above, the present invention can avoid an enlargement of chip size in a direction perpendicular to the extension of the word lines. In addition, the present invention can avoid chip-size enlargement in a direction of the extension of the word lines. This is achieved by arranging device areas of devices constituting the sub-word decoders such that the same conductive types of device areas are situated alongside between adjacent sub-word decoders.

Figure 6:
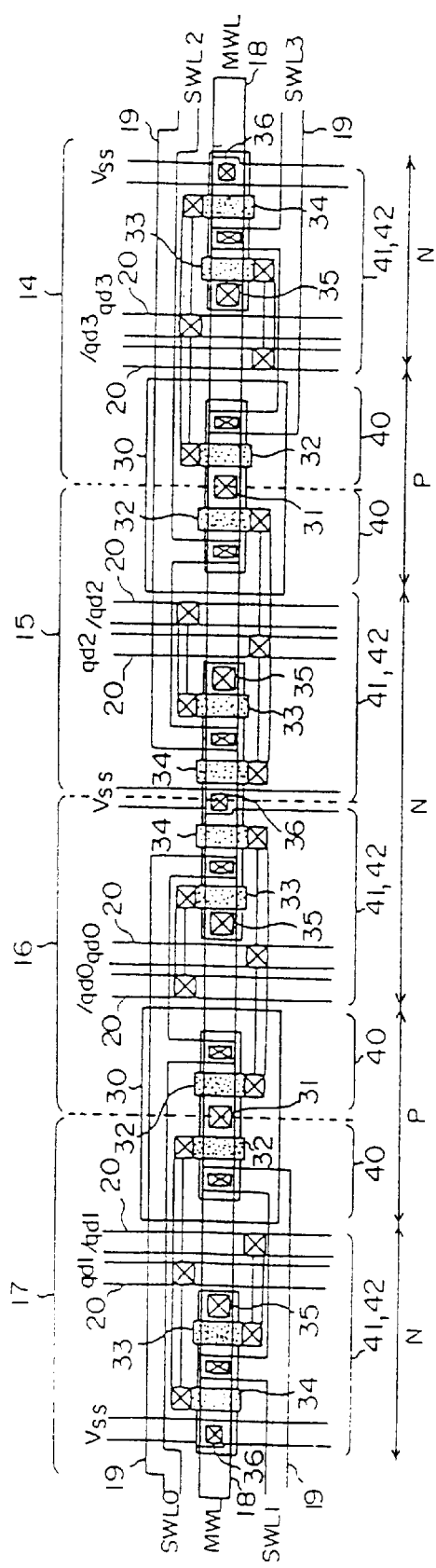
FIG. 6 is an illustrative drawing showing a layout of the sub-word decoders on a substrate of a semiconductor memory device.
Figure 7:
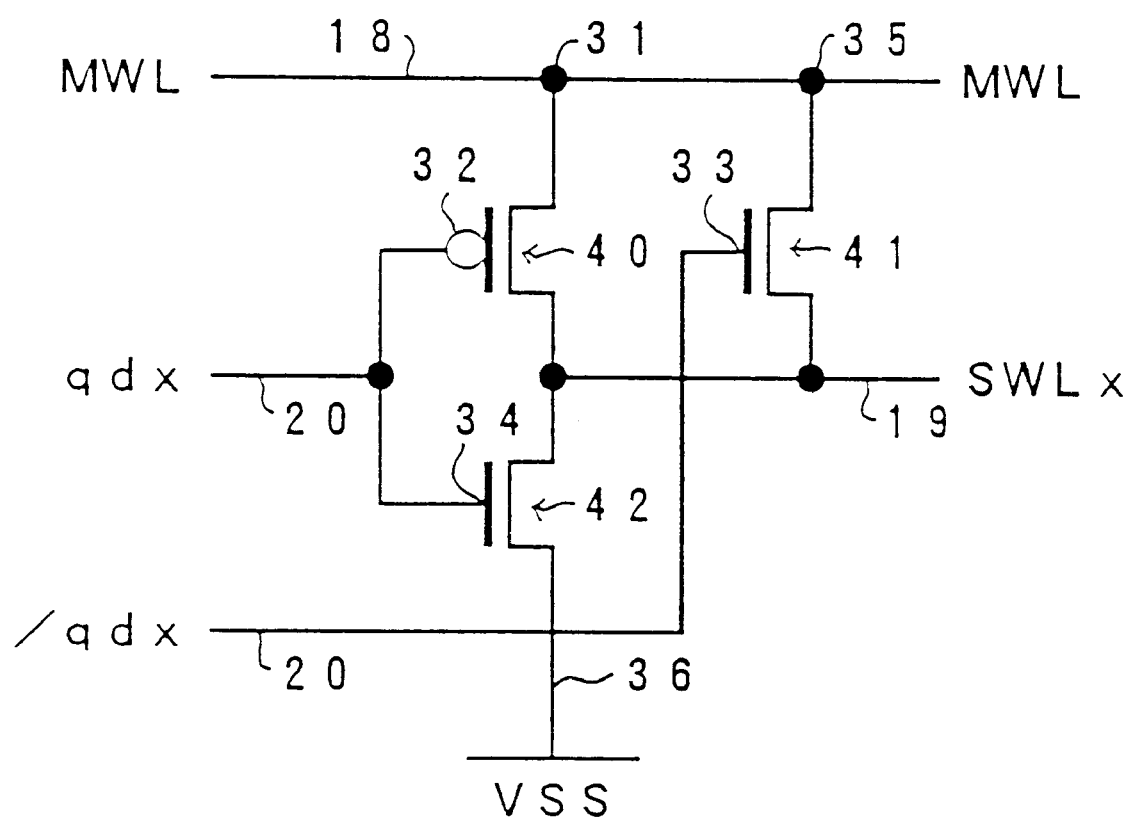
FIG. 7 is a circuit diagram of each sub-word decoder.

FIG. 6 is an illustrative drawing showing a layout of sub-word decoders on a substrate of a semiconductor memory device. FIG. 7 is a circuit diagram of each sub-word decoder. In FIGS. 4 and 5, the same elements are referred to by the same numerals.

In FIG. 6, the sub-word decoders 14 through 17 are formed on a P-type substrate. Each of the sub-word decoders 14 through 17 receives a main-word-line-selection signal MWL from the main-word line 18 and sub-word-decoder-selection signals qdx and /qdx (x=0, 1, 2, 3) from the sub-word-decoder selection lines 20. The sub-word decoders 14 through 17 output sub-word-line-selection signals SWLx (x=0, 1, 2, 3) to the sub-word lines 19.

Each of the sub-word decoders 14 through 17 shown in FIG. 7 include a PMOS transistor 40, an NMOS transistor 41, and an NMOS transistor 42. The sub-word-decoder-selection signal qdx is applied to gate inputs of the PMOS transistor 40 and the NMOS transistor 42, and the sub-word-decoder-selection signal /qdx is supplied to a gate input of the NMOS transistor 41. When the sub-word-decoder-selection signal qdx is LOW and the sub-word-decoder-selection signal /qdx is HIGH, the main-word-line-selection signal MWL is output as the sub-word-line-selection signals SWLx.

With reference to FIG. 6 and FIG. 7, the PMOS transistor 40 having a gate 32 is connected to the main-word line 18 via a contact 31. The NMOS transistor 41, which has a gate 33, is connected to the main-word line 18 via a contact 35. Further, the NMOS transistor 42 having a gate 34 is connected to the ground voltage VSS via a contact 36.

In FIG. 6, N-wells 30 are formed in the P-type substrate. On the N-wells 30 are formed the PMOS transistors 40. The NMOS transistors 41 and the NMOS transistors 42 are formed on the P-type substrate.

As shown in FIG. 6, the sub-word decoders of the present invention are arranged such that adjacent sub-word decoders share the same device area. Namely, a P-channel-transistor area (an area where the PMOS transistor 40 is formed) of the sub-word decoder 14 and a P-channel-transistor area of the sub-word decoder 15 are provided in the same N-well 30. Also, an N-channel-transistor area (an area where the NMOS transistors 41 and 42 are arranged) of the sub-word decoder 15 is situated alongside an N-channel-transistor area of the sub-word decoder 16. Further, a P-channel-transistor area of the sub-word decoder 16 is adjacent to a P-channel-transistor area of the sub-word decoder 17 so that these P-channel transistor areas share the same N-well 30.

As described above, the present invention arranges the sub-word decoders such that either one of the N-channel-transistor area and the P-channel-transistor area of a given sub-word decoder is situated alongside an area of the same type of an adjacent sub-word decoder. When an N-well is formed in a P-type substrate in general, an N-channel transistor needs to keep some distance from the N-well when the N-channel transistor is formed on the P-type substrate. According to the sub-word-decoder configuration of the present invention, such a requirement regarding a distance does not impose a restriction on the positioning of adjacent sub-word decoders, so that the adjacent sub-word decoders are arranged in close proximity. Because of this, the present invention can avoid chip-size enlargement in a direction of the extension of the main-word lines 18.

In the above, a configuration of sub-word decoders has been described. In this configuration, sub-word decoders are provided for each column block without enlarging a chip size. As was previously described, it becomes necessary to provide sub-word decoders for each column block when a semiconductor memory device is designed to activate only one sense-amplifier block with an aim of reducing power consumption. When sub-word decoders activate sub-word lines only within a selected column block, no data destruction occurs.

There is another way to avoid the destruction of data when only a selected part of sense-amplifier blocks is activated. In the following, a problem of data destruction will be further illustrated in detail, selectively operates the sense-amplifier blocks 1204 of this row block. In general, all the sense-amplifier blocks 1204 are operated with respect to a selected row block.

In semiconductor devices, it is preferable to reduce power consumption as much as possible. In order to meet this demand, a column address may be supplied by the time when a row access is performed, so as to allow sense amplifiers to operate only with respect to a column block of a selected column address.

Figure 9:
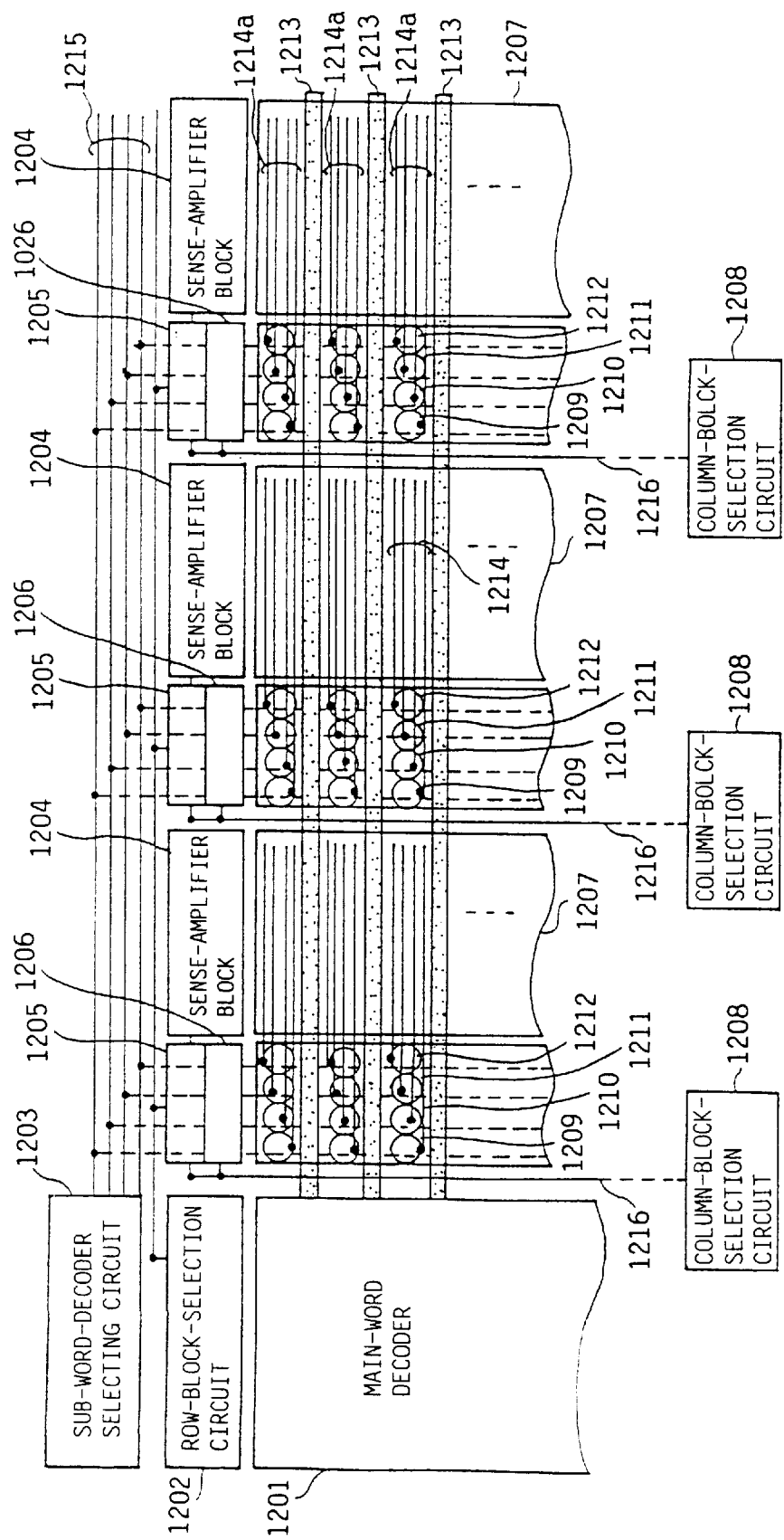
FIG. 9 is an illustrative drawing showing a related-art configuration which activates only a selected column block in a hierarchical word-decode scheme.

FIG. 9 is an illustrative drawing showing a configuration which activates only a selected column block in the hierarchical word-decode scheme.

In the configuration of FIG. 9, all the sense-amplifier blocks 1204 are not driven, but only one of the sense-amplifier blocks 1204 is operated with respect to a selected column address. Column-block-selection circuits 1208 are provided for this purpose.

Before a row access is performed, a column address is supplied to the device, and the column-block-selection circuits 1208 select a column block corresponding to an indicated column address. Column-block-selection lines 1216 extend from the column-block-selection circuits 1208, and are connected to sense-amplifier-control circuits 1205 and sub-word-decoder-control circuits 1206. The sense-amplifier-control circuits 1205 drive only one of the sense-amplifier blocks 1204 selected by the column-block-selection circuits 1208 in a selected row block when the row-block-selection circuit 1202 selects this row block. The sub-word-decoder-control circuits 1206 supplies selection signals from the sub-word-decoder selecting circuit 1203 to the sub-word decoders 1209 through 1212 only in the column block selected by the column-block-selection circuits 1208.

In this manner, data access is made to a memory-cell array 1207 of a selected column with and, then, further embodiments of the present invention will be described.

Figure 8:
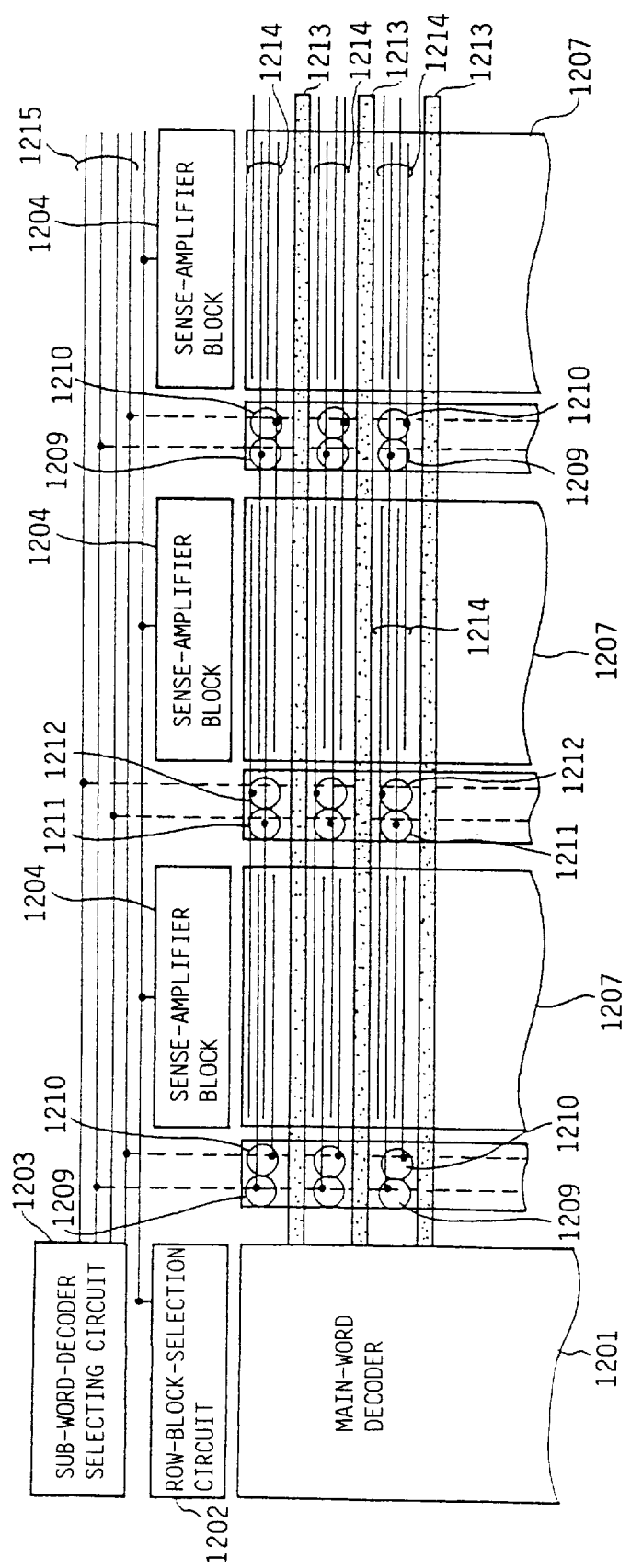
FIG. 8 is an illustrative drawing showing a word-line structure according to a related-art hierarchical word-decode scheme.

FIG. 8 is an illustrative drawing showing a word-line structure according to a related-art hierarchical word-decode scheme. A main-word decoder 1201 decodes a row address to select one of main-word lines 1213, and turns the selected main-word line to HIGH. The main-word lines 1213 are provided on a wiring layer. In a different wiring layer, four sub-word lines 1214 are laid out generally under the main-word lines 1213. The sub-word lines 1214 are connected to four types of sub-word decoders 1209 through 1212, respectively. The sub-word decoders of the same type are arranged in a row perpendicular to the extension of the main-word lines 1213.

A sub-word-decoder selecting circuit 1203 selects one type of sub-word decoders from among the four types of the sub-word decoders 1209 through 1212 via the sub-word-decoder selection lines 1215. The selected type of the sub-word decoders connects the main-word lines 1213 to the sub-word lines 1214. As a result, only one of the four sub-word lines 1214 connected to the selected one of the main-word lines 1213 becomes HIGH when this sub-word line 1214 is selected by the sub-word-decoder selecting circuit 1203. This achieves a hierarchical word selection. In the case of data-read operations, for example, data stored in memory-cell arrays 1207 is read by sense amplifiers of sense-amplifier blocks 1204 only with respect to the selected word.

The memory-cell arrays 1207 are arranged in a plurality of column blocks along a column direction (horizontal direction in the figure) as well as in a plurality of row blocks along a row direction (vertical direction in the figure). FIG. 8 only shows a configuration of one row block. This row block is selected when a row-block-selection circuit 1202 respect to a selected row block, and one of the sense-amplifier blocks 1204 is operated only with respect to the selected column block. This achieves a reduction in power consumption.

In the configuration of FIG. 8, the sub-word lines 1214 extend over two adjacent column blocks, and the memory-cell arrays 1207 of these column blocks share the sub-word lines. On the other hand, the sub- word lines 1214a of FIG. 9 are separately provided for each column block, and a single span of the sub-word lines 1214a is used by only one of the memory-cell arrays 1207.

When the sub-word lines 1214 are shared as shown in FIG. 8, the number of the sub-word decoders 1209 through 1212 is half as many as those of the configuration of FIG. 9. A chip size in the horizontal direction of the figure thus can be reduced. Further, intervals of contacts (not shown) connecting the sub-word lines 1214 with the sub-word decoders 1209 through 1212 can be twice as long as those of the configuration of FIG. 9. This makes it possible to increase a layout density of the sub-word lines 1214, thereby reducing a chip size in a vertical direction of the figure.

In this manner, the configuration in which sub-word lines are shared has an advantage over the configuration which employs no sharing of sub-word lines because the chip size can be reduced.

However, the configuration of FIG. 9 is necessary when selective activation of column blocks is to be implemented. This is because a data read operation must be conducted only with respect to a selected column block when only one of the sense-amplifier blocks 1204 is activated for this column block.

Assume that a column block is selectively activated in the configuration of FIG. 6 in which sub-word lines 1214 are shared by two adjacent column blocks. Since the sub-word lines 1214 extend across two adjacent column blocks, data is read from the memory-cell arrays 1207 of two adjacent column blocks even when sub-word decoders are selected with an aim of activating only one column block. If only one of the sense-amplifier blocks 1204 is operated, data cannot be stored in sense amplifiers in one of the two activated column blocks where no sense-amplifier block 1204 is activated. This ends up failing to restore data in the memory-cell array 1207. As a result, the data of the memory-cell array 1207 is destroyed.

Accordingly, there is a need for a semiconductor memory device which can achieve a selective activation of column blocks without increasing chip size.

In the following, further embodiments of the present invention will be described with reference to the accompanying drawings.

Figure 10:
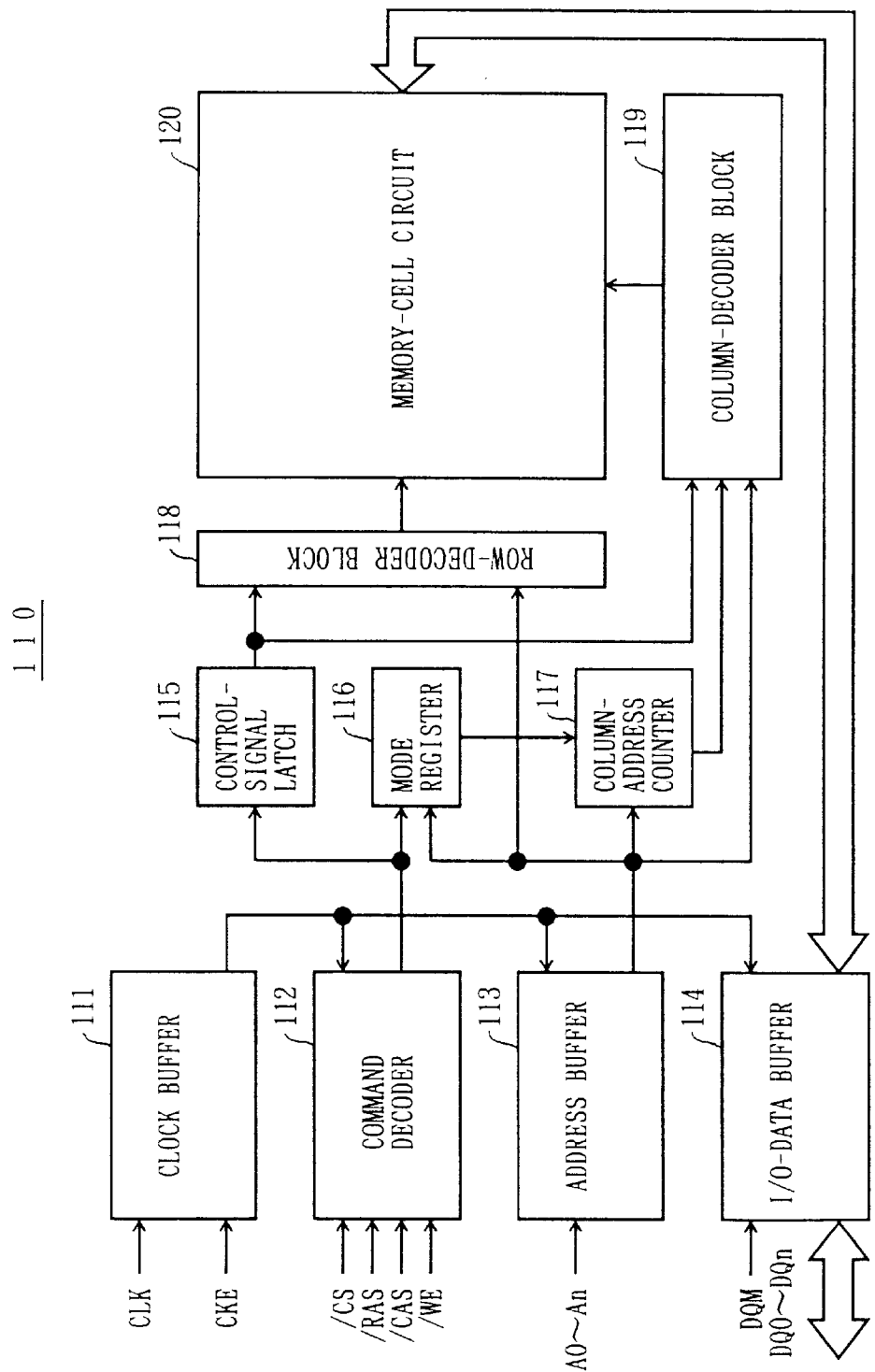
FIG. 10 is a block diagram of another embodiment of a semiconductor memory device according to the present invention.

FIG. 10 is a block diagram of another embodiment of a semiconductor memory device according to the present invention.

Figure 1:
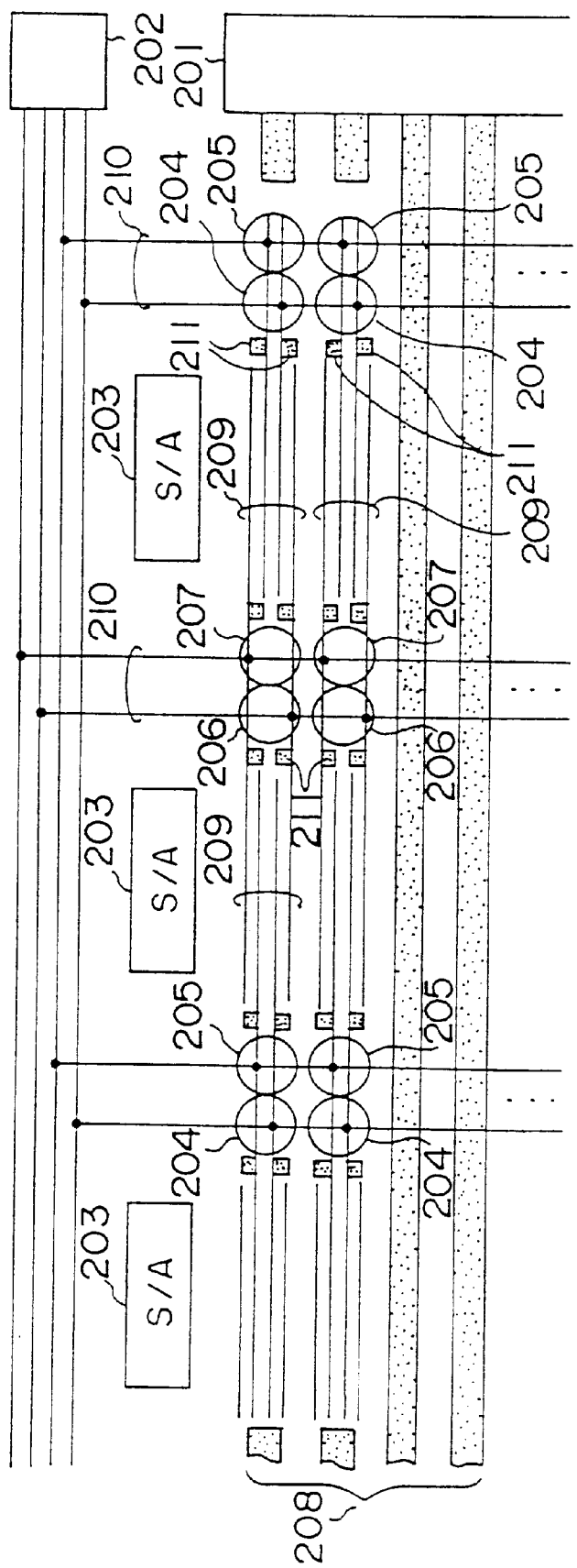
FIG. 1 is an illustrative drawing showing a word-line structure according to a related-art hierarchical word-decode scheme.
Figure 2:
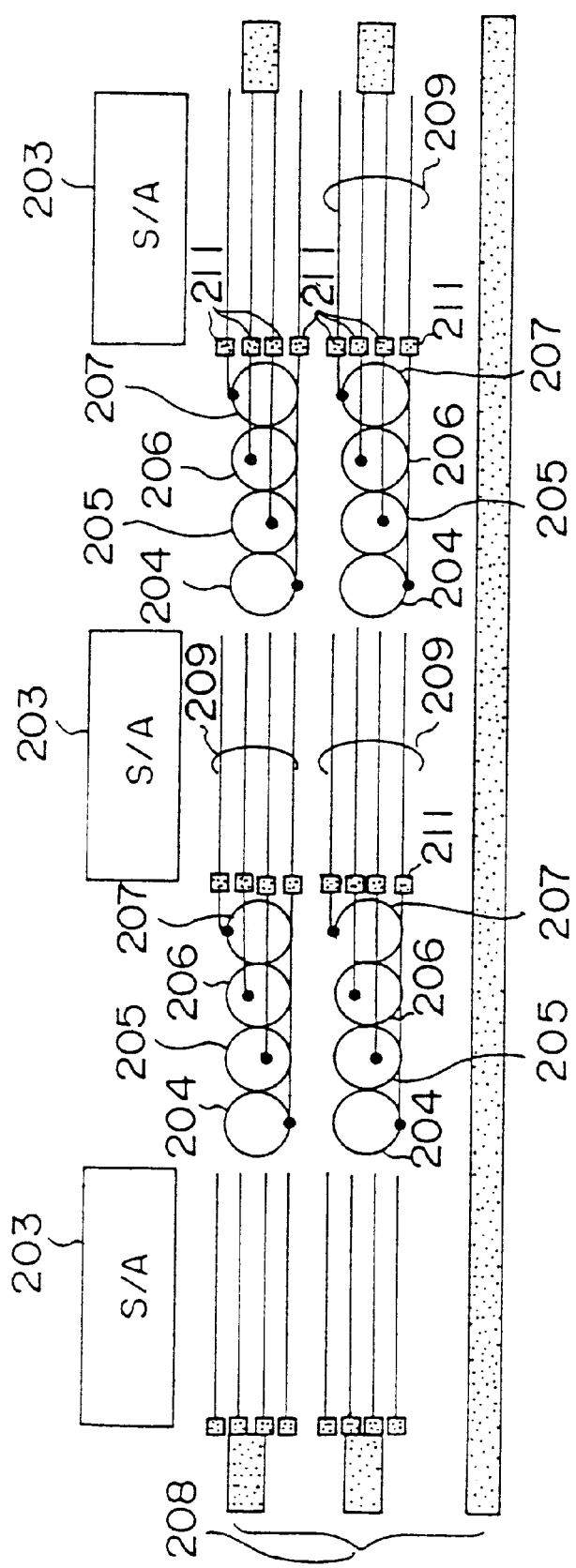
FIG. 2 is an illustrative drawing showing another word-line structure according to the related-art hierarchical word-decode scheme.

A semiconductor memory device 110 of FIG. 1 includes a clock buffer 111, a command decoder 112, an address buffer 113, an I/O-data buffer 114, a control-signal latch 115, a mode register 116, a column-address counter 117, a row-decoder block 118, a column-decoder block 119, and a memory-cell circuit 120.

The address buffer 113 receives and buffers address signals A0 through An. The address buffer 113 supplies a row address to the row-decoder block 118, and supplies a column address to the column-address counter 117 and the column-decoder block 119. The command decoder 112 receives command signals /CS, /RAS, /CAS, and /WE, and decodes the command signals. Decoding results are sent to the control-signal latch 115 and the mode register 116. Based on the decoding results, the control-signal latch 115 controls the row-decoder block 118 and the column-decoder block 119. The memory-cell circuit 120 includes a memory-cell array, main-word lines, sub-word lines, bit lines, sense amplifiers, etc.

The row-decoder block 118 selects and activates a main-word line and a sub-word line corresponding to an indicated row address to effect a data exchange between corresponding memory cells and sense amplifiers. In the semiconductor memory device 110, a column address is already available when the row-decoder block 118 performs a row-address access. By referring to this column address, the column-decoder block 119 selects a column block corresponding to the indicated column address, so that the row-address access is performed only in the selected column block. Namely, sense amplifiers are driven and sub-word lines are activated by the row-decoder block 118 only within the selected column block.

The column-decoder block 119 makes an access to the indicated column address in the selected column block. This achieves a data exchange between the I/O-data buffer 114 and a sense amplifier of the indicated column address. The I/O-data buffer 114 receives data DQ0 through DQn from the outside of the semiconductor memory device 110 to supply the data to the memory-cell circuit 120, or receives data from the memory-cell circuit 120 to supply the data DQ0 through DQn to the outside of the semiconductor memory device 110.

The clock buffer 111 receives a clock signal CLK. In synchronism with the clock signal CLK, data latch operations are performed in the command decoder 112, the address buffer 113, and the I/O-data buffer 114. Each element of the semiconductor memory device 110 operates in synchronism with either the clock signal CLK or an internal clock signal which is generated based on the clock signal CLK.

The column-address counter 117 generates consecutive column addresses internally, and supplies these addresses to the column-decoder block 119. The consecutive column addresses are used in circumstances such as when data in the memory-cell circuit 120 needs to be refreshed in a refresh mode or when data of consecutive column addresses needs to be read from the same row address in a page mode. Selection of one of these mode is made by writing mode setting data in the mode register 116 as the mode setting data is provided as address data.

Figure 11:
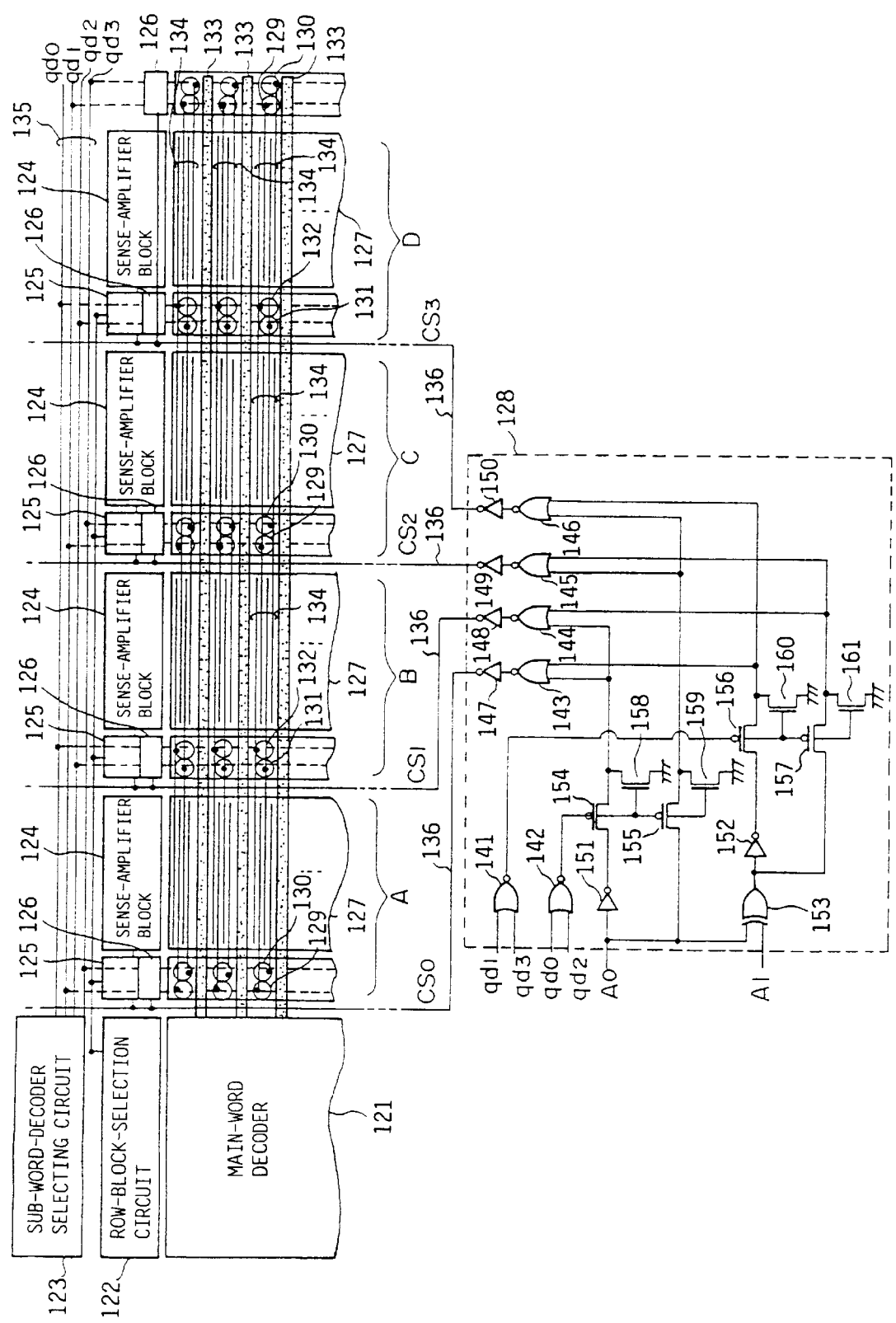
FIG. 11 is an illustrative drawing showing a first embodiment of a column-block-selective-activation mechanism according to the present invention.

FIG. 11 is an illustrative drawing showing a first embodiment of a column-block-selective-activation mechanism according to the present invention. FIG. 11 shows relevant portions of the row-decoder block 118, the column-decoder block 119, and the memory-cell circuit 120 of FIG. 10 with regard to column-block-selective activation.

Memory-cell arrays 127 are arranged to have a plurality of column blocks in a column direction (horizontal direction in the figure) and a plurality of row blocks in a row direction (vertical direction in the figure). FIG. 11 only shows a configuration of one row block, and the row-block-selection circuit 122 is used for selecting this row block.

In the present invention, all the sense-amplifier blocks 124 are not operated in the selected row block. Only one of the sense-amplifier blocks 124 corresponding to an indicated column address is operated, and, in addition, another one of the sense-amplifier blocks 124 is driven with respect to a column block which shares sub-word lines 134 with the above column block. To achieve this, a column-block-selection circuit 128 is used.

A column address is already available when row access is made. The column-block-selection circuit 128 selects a first column block corresponding to the indicated column address and a second column block sharing the sub-word lines 134 with the first column block. Column-block-selection lines 136 extend from the column-block-selection circuit 128, and are connected to sense-amplifier-control circuits 125 and sub-word-decoder-control circuits 126. The sense-amplifier-control circuits 125 activates the sense-amplifier blocks 124 only with respect to the first and second column blocks selected by the column-block-selection circuit 128 only in a selected row block when this row block is selected by the row-block-selection circuit 122. The sub-word-decoder-control circuits 126 supply selection signals qd0 through qd3 to sub-word decoders 129 through 132 only in the first and second column blocks, which are selected by the column-block-selection circuit 128.

The sub-word-decoder selecting circuit 123 selects one type of sub-word decoders from four types of the sub-word decoders 129 through 132 by supplying the selection signals qd0 through qd3 via sub-word-decoder selecting lines 135. When being selected, a selected type of the sub-word decoders 129 through 132 connects main-word lines 133 to the sub-word lines 134. In this manner, only one of the sub-word lines 134 selected by the sub-word-decoder selecting circuit 123 becomes HIGH when this sub-word line is connected to one of the main-word lines 133 selected by a main-word decoder 121.

In this manner, a first column block corresponding to a selected column address and a second column block sharing the sub-word lines 134 with the first column block are selected, and data access to the memory-cell arrays 127 is made only with respect to the first and second column blocks. Further, the sense-amplifier blocks 124 are activated accordingly in the first and second column blocks. Even under the circumstance that the sub-word lines 134 are shared by column blocks, therefore, selective activation of column blocks can be implemented without destroying data of the memory-cell arrays 127.

The column-block-selection circuit 128 of FIG. 11 includes NOR circuits 141 through 146, inverters 147 through 152, an XOR circuit 153, PMOS transistors 154 through 157, and NMOS transistors 158 through 161. The column-block-selection circuit 128 receives the selection signals qd0 through qd3 from the sub-word-decoder selecting circuit 123, and, also, receives two bits A0 and A1 of the column address signal A0 through An. The selection signals qd0 through qd3 are such that only one of these signals becomes HIGH, corresponding to a sub-word decoder to be selected, and remaining ones of these signals are LOW.

The NOR circuit 141 receives the selection signals qd1 and qd3, and the NOR circuit 142 receives the selection signals qd0 and qd2. When either the selection signal qd1 or the selection signal qd3 is HIGH, the PMOS transistors 156 and 157 are turned on. When either the selection signal qd0 or the selection signal qd2 is HIGH, the PMOS transistors 154 and 155 are turned on. Drain nodes of the PMOS transistors 154 and 157 are connected to the ground when these PMOS transistors are not turned on because a ground connection is established when a corresponding one of NMOS transistors 158 through 161 is turned on.

FIG. 11 shows four column blocks A through D as an example. These four column blocks have an assigned column address as follows.

| Column Block | Column Address (A0, A1) |
| --- | --- |
| A | (0, 0) |
| B | (0, 1) |
| C | (1, 0) |
| D | (1, 1) |

The following is combinations of two column blocks which are selected by a sub-word decoder when one of the selection signals qd0 through qd3 is selected.

| Selection Signal | Selected Column Block |
| --- | --- |
| qd0 | (A, B) or (C, D) |
| qd1 | (A, D) or (B, C) |
| qd2 | (A, B) or (C, D) |
| qd3 | (A, D) or (B, C) |

These combinations can be confirmed by examining connections between the sub-word-decoder selecting lines 135 and the sub-word decoders 129 through 132 in FIG. 11. As can be seen from the above two tables, when a selection signal qd0 or qd2 is selected, an address bit A0 should be examined to determine whether the pair of column blocks (A, B) or the pair of column blocks (C, D) is selected. That is, the pair of column blocks (A, B) is selected when the address bit A0 is 0, and the pair of column blocks (C, D) is selected when the address bit A0 is 1. On the other hand, when a selection signal qd1 or qd3 is selected, a combination of address bits A0 and A1 should be examined to determine whether the pair of column blocks (B, C) or the pair of column blocks (A, D) is selected. That is, the pair of column blocks (B, C) is selected when the address bits A0 and A1 are different, and the pair of column blocks (A, D) is selected when the address bits A0 and A1 are the same. By selecting a pair of column blocks in this manner, two column blocks which share sub-word lines selected by sub-word decoders can be identified.

The column-block-selection circuit 128 of FIG. 11 is designed to select a pair of column blocks as in the manner described in the above. That is, the column-block-selection circuit 128 generates column-block-selection signals CS0 through CS3 by examining the address bit A0 when either the selection signal qd0 or the selection signal qd2 is selected, and generates column-block-selection signals CS0 through CS3 by examining an EXOR of the address bits A0 and A1 when either the selection signal qd1 or the selection signal qd3 is selected.

In the example of FIG. 11, the number of column blocks is four. If the number of column blocks is eight, for example, three address bits A0, A1, and A2 are used along with the selection signals qd0 through qd3 to select a pair of column blocks. A circuit configuration to achieve this operation is basically the same as that of FIG. 11, and is well within ordinary skill in the art. A description of such a circuit configuration will be omitted.

Figure 12:
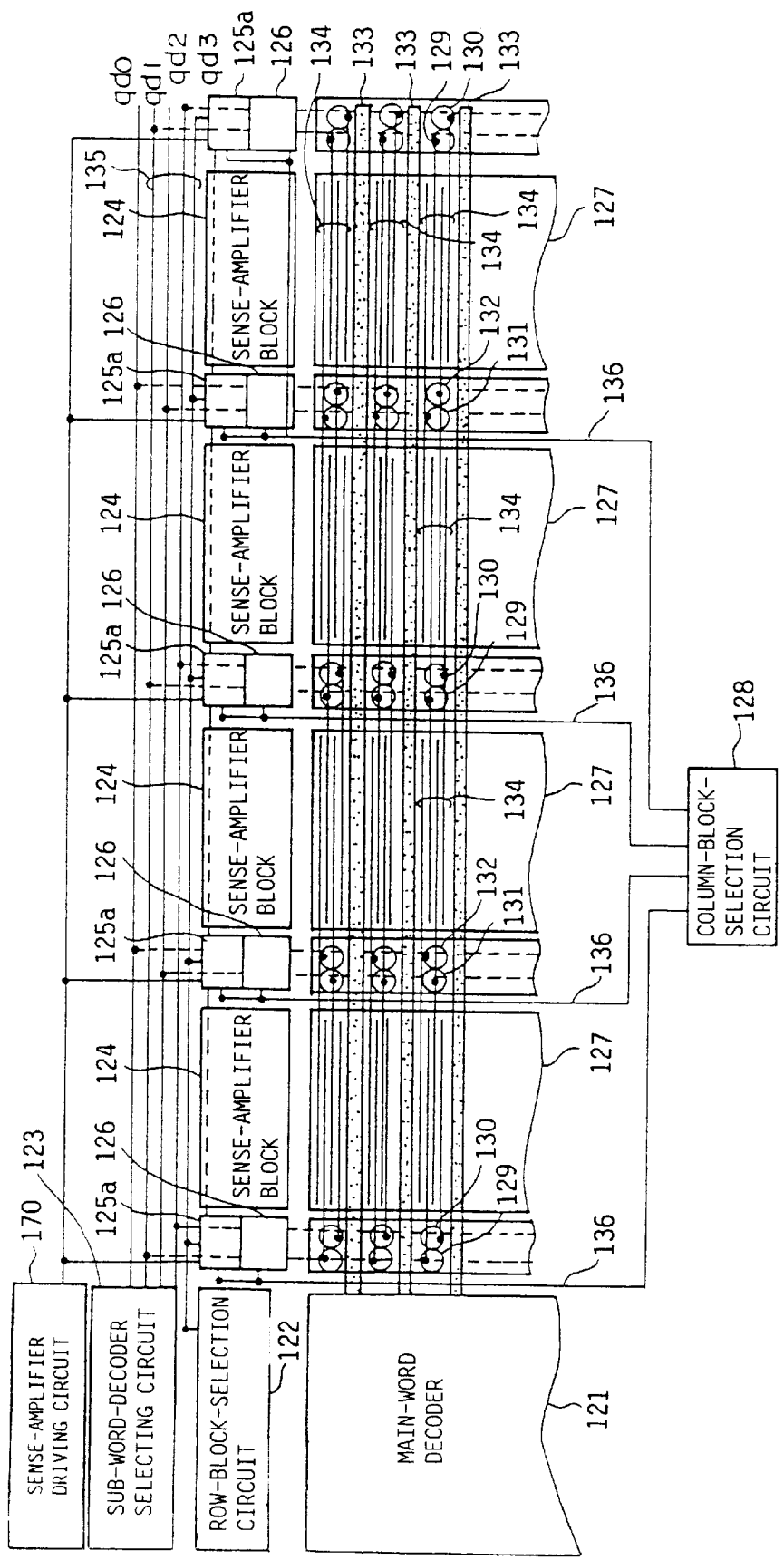
FIG. 12 is an illustrative drawing showing a second embodiment of a column-block-selective-activation mechanism according to the present invention.

FIG. 12 is an illustrative drawing showing a second embodiment of a column-block-selective-activation mechanism according to the present invention. In FIG. 12, the same elements as those of FIG. 11 are referred to by the same numerals, and a description thereof will be omitted.

In FIG. 12, sense-amplifier-control circuits 125a are provided in place of the sense-amplifier-control circuits 125 of FIG. 11. Further, a sense-amplifier driving circuit 170 is explicitly shown in FIG. 12 whereas this element is omitted in FIG. 11. The sense-amplifier driving circuit 170 supplies a driving current to the sense-amplifier blocks 124 via the sense-amplifier-control circuits 125a. The sense-amplifier-control circuits 125a are characterized in that they provide the sense-amplifier blocks 124 with the driving current from either side of each sense-amplifier block.

Figure 13:
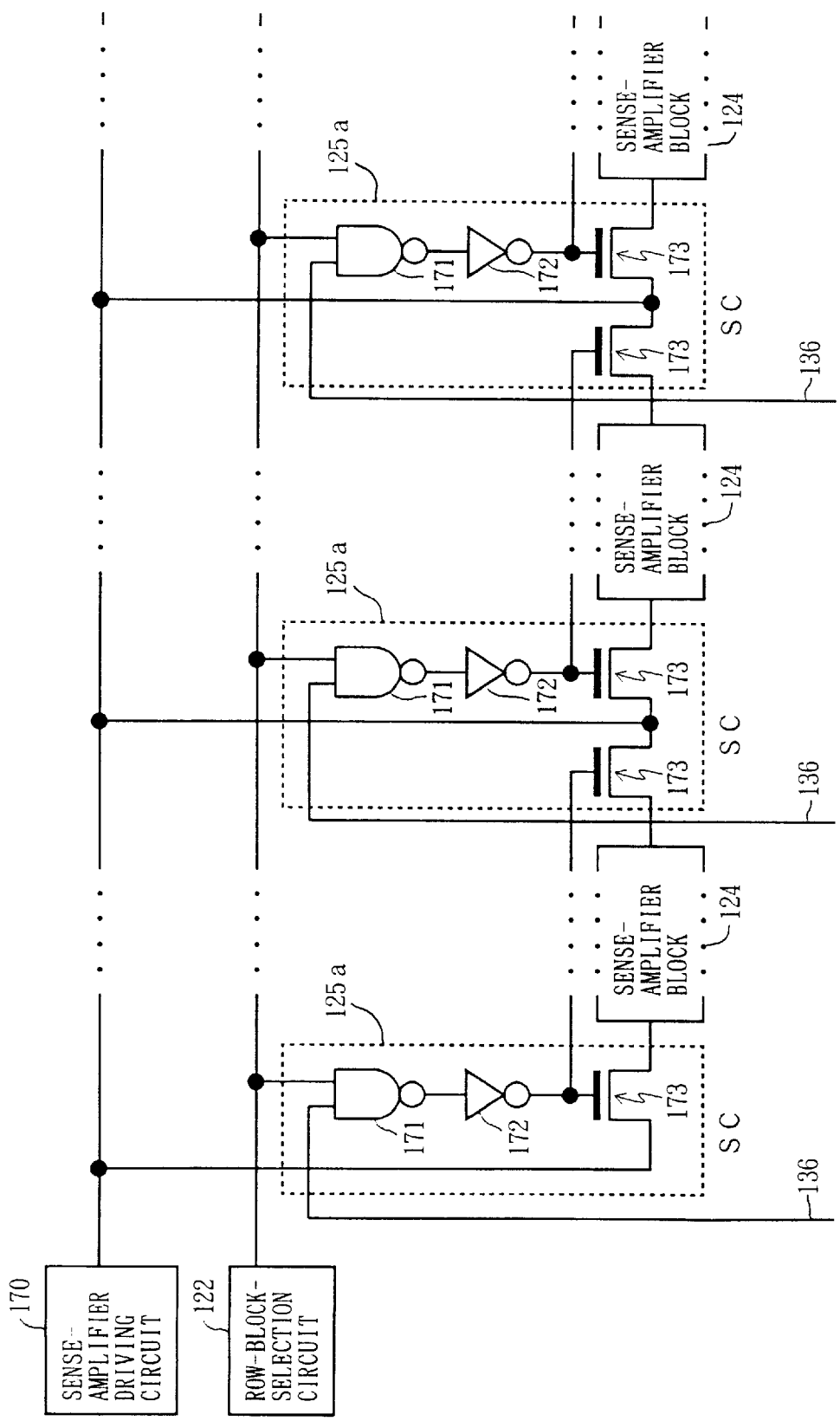
FIG. 13 is a circuit diagram of a sense-amplifier-control circuits.

FIG. 13 is a circuit diagram of the sense-amplifier-control circuits 125a. In FIG. 13, the same elements are those of FIG. 12 are referred to by the same numerals.

In FIG. 13, each of the sense-amplifier-control circuits 125a includes a NAND circuit 171, an inverter 172, and one or two NMOS transistors 173. Only one NMOS transistor 173 is provided for a sense-amplifier-control circuit 125a which is the last one provided at an end in a series of the sense-amplifier-control circuits 125a. The other sense-amplifier-control circuits 125a are provided with two NMOS transistors 173.

Each of the sense-amplifier-control circuits 125a receives a column-block-selection signal from a corresponding one of the column-block-selection lines 136 and a row-block-selection signal from the row-block-selection circuit 122. The NAND circuit 171 and the inverter 172 take an AND operation between the supplied selection signals. An output of the inverter 172 becomes HIGH when a relevant row block and a relevant column block are selected. The output of the inverter 172 is supplied to the NMOS transistor 173 of the same sense-amplifier-control circuit 125a, and, also, is supplied to the NMOS transistor 173 of another sense-amplifier-control circuit 125a positioned next on the right. These NMOS transistors 173 are thus turned on, and the driving signal from the sense-amplifier driving circuit 170 is fed into a sense-amplifier block 124 from either side thereof as this sense-amplifier block 124 is sandwiched between these NMOS transistors 173.

In this manner, the second embodiment described above supplies the driving current to the sense amplifiers of each sense-amplifier block 124 from either side thereof. This makes it possible to reduce a start-up time of the sense amplifiers of the sense-amplifier blocks 124, thereby boosting operational speed.

Figure 14:
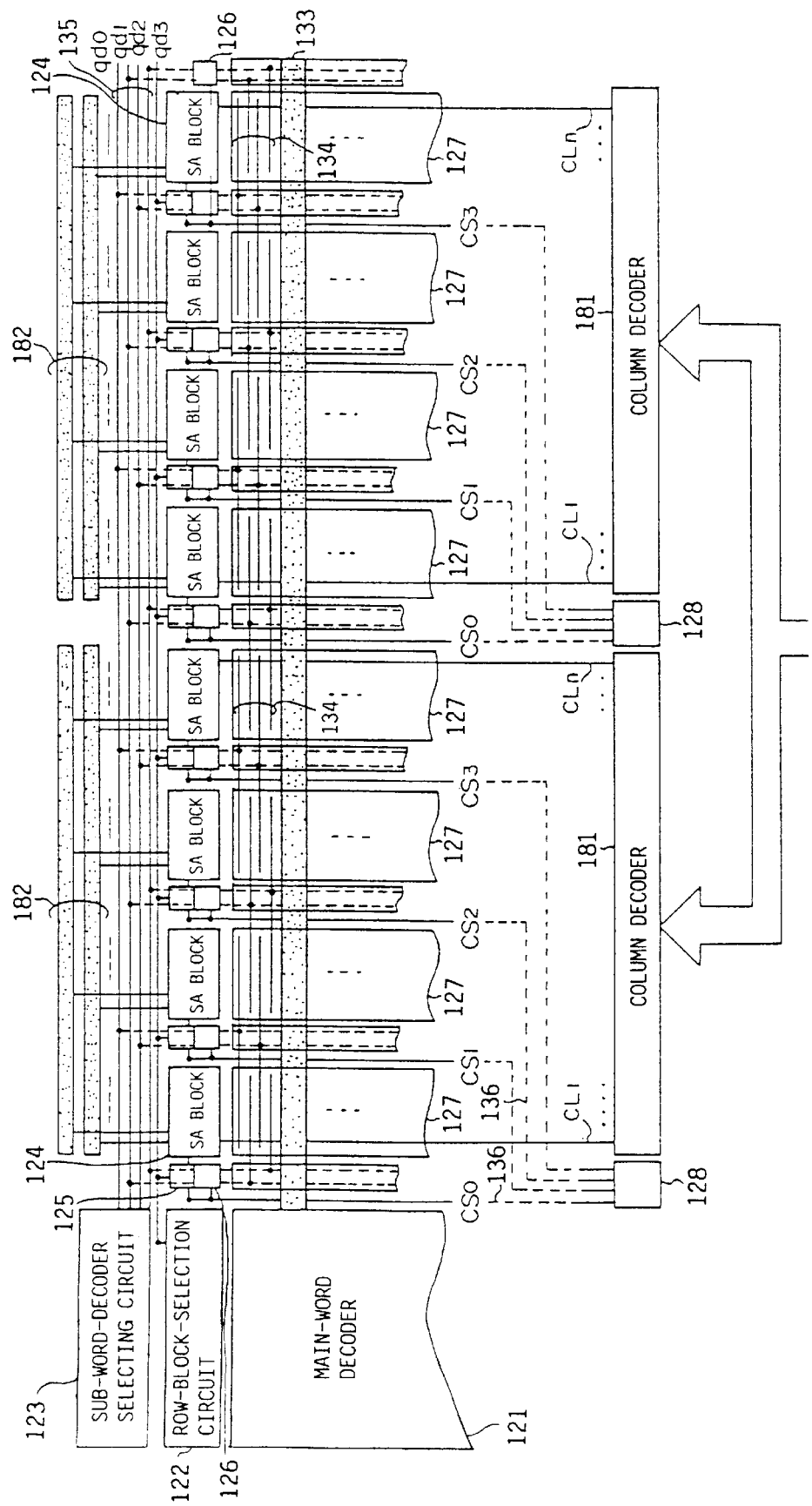
FIG. 14 is an illustrative drawing showing an embodiment in which column-selection lines are selected by counting up column addresses in a column-address counter of FIG. 10.

FIG. 14 is an illustrative drawing showing an embodiment in which column-selection lines are selected by counting up column addresses in the column-address counter 117 of FIG. 10. In FIG. 14, the same elements as those of FIG. 11 are referred to by the same numerals, and a description thereof will be omitted.

In FIG. 5, column decoders 181 select one of column-selection lines CL1 through CLn. The column-selection lines CL1 through CLn are connected to the sense-amplifier blocks 124. When a data-read operation is conducted, for example, data is read from one of the sense amplifiers corresponding to a selected column-selection line, and is conveyed through local-data bus 82. When the column-address counter 117 of FIG. 10 counts up a column address to generate consecutive column addresses, one of the sense-amplifier blocks 124 is activated immediately after a sense amplifier provided at an end as the last one in a series of sense amplifiers is selected by a column-selection line in an adjacent sense-amplifier block 124 provided on the left. In this manner, the column address is counted up to select successively one of the column-selection lines CL1 through CLn. As this happens, the sense-amplifier blocks 124 are also successively selected according to the successive column addresses. When the last one, i.e., the column-selection line CLn, is selected, the first one, i.e., the column-selection line CL1, is selected again to repeat the selection procedure.

As described in the above, the selective activation of the column blocks according to the present invention is workable even when the column address is successively counted up. That is, successive column addresses can be accessed one after another by successively activating sense-amplifier blocks.

According to the present invention which has been described with reference to FIG. 10 through FIG. 14, the sense-amplifier blocks are selectively activated with respect to column blocks which share selectively activated sub-word lines, so that power consumption can be reduced while avoiding data destruction which would occur when accessed data is not stored in the sense-amplifier blocks.

Further, selection of the column blocks in which the sense amplifiers are activated may be made based on the column-address signals and the signals for selecting the sub-word lines.

Also, the selection of the column blocks may be made by using a predetermined number of bits extracted from the most-significant-bit side of the column address and the signals for selecting the sub-word lines.

Moreover, when a plurality of row blocks and a plurality of column blocks are provided, the sense-amplifier blocks in a selected row block are selectively activated with respect to column blocks which share selectively activated sub-word lines, so that power consumption can be reduced while avoiding data destruction which would occur when accessed data is not stored in the sense-amplifier blocks.

Further, a high-speed activation of the sense-amplifier blocks is achieved by providing a driving current from both sides of a sense-amplifier block.

Also, even when column addresses are counted up to successively access consecutive column addresses, the sense-amplifier blocks are successively activated accordingly, so that power consumption can be reduced while avoiding data destruction which would occur when accessed data is not stored in the sense-amplifier blocks.

Further, the present invention is not limited to these embodiments, but various variations and modifications may be made without departing from the scope of the present invention.

What is claimed is:

1. A semiconductor memory device having a hierarchical word line structure, comprising:

a plurality of column blocks, each including a plurality of sub-word lines which are connected to memory cells and separated at each boundary between said column blocks; and sub-word decoders disposed on both sides of each of said column blocks to select the sub-word lines, wherein the sub-word decoders disposed between neighboring column blocks are coupled to the sub-word lines of only one of said neighboring column blocks.

2. The semiconductor memory device as claimed in claim 1, wherein said sub-word lines are selected only in a selected one of said column blocks.

3. The semiconductor memory device as claimed in claim 2, further comprising sense-amplifier blocks, each of which is provided for a corresponding one of said column blocks, wherein only one of said sense-amplifier blocks corresponding to said selected one of said column blocks is activated.

4. The semiconductor memory device as claimed in claim 1, wherein every other one of said sub-word lines is connected to said sub-word decoders provided on a first side of said given one of a column blocks, and remaining ones of said sub-word lines are connected to said sub-word decoders provided on a second side of said given one of said column blocks.

5. The semiconductor memory device as claimed in claim 1, wherein every other pair of said sub-word lines is connected to said sub-word decoders provided on a first side of said given one of a column blocks, and remaining pairs of said sub-word lines are connected to said sub-word decoders provided on a second side of said given one of said column blocks.

6. The semiconductor memory device as claimed in claim 1, wherein each of said sub-word decoders includes an NMOS transistor, a PMOS transistor, and a first substrate area where said NMOS transistor is formed, and said first substrate area of a given one of said sub-word decoders is situated alongside said first substrate area of an adjacent one of said sub-word decoders.

7. The semiconductor memory device as claimed in claim 1, wherein each of said sub-word decoders includes an NMOS transistor, a PMOS transistor, and a second substrate area where said PMOS transistor is formed, and said second substrate area of a given one of said sub-word decoders is situated alongside said second substrate area of an adjacent one of said sub-word decoders.

8. A semiconductor memory device comprising:

a plurality of main-word lines;

a main-word decoder selecting one of said plurality of main-word lines;

a plurality of column blocks, each including a plurality of sub-word lines which are connected to memory cells and separated at each boundary between said column blocks; and sub-word decoders, disposed on both sides of each of said column blocks, for coupling said main-word lines to the sub-word lines, wherein the sub-word decoders disposed between neighboring column blocks are coupled to the sub-word lines of only one of said neighboring column blocks.

9. The semiconductor memory device as claimed in claim 8, wherein said sub-word lines are selected only in a selected one of said column blocks.

10. The semiconductor memory device as claimed in claim 9, further comprising sense-amplifier blocks, each of which is provided for a corresponding one of said column blocks, wherein only one of said sense-amplifier blocks corresponding to said selected one of said column blocks is activated.

11. The semiconductor memory device as claimed in claim 8, wherein each of said sub-word decoders includes an NMOS transistor, a PMOS transistor, and a first substrate area where said NMOS transistor is formed, and said first substrate area of a given one of said sub-word decoders is situated alongside said first substrate area of an adjacent one of said sub-word decoders.

12. The semiconductor memory device as claimed in claim 8, wherein each of said sub-word decoders includes an NMOS transistor, a PMOS transistor, and a second substrate area where said PMOS transistor is formed, and said second substrate area of a given one of said sub-word decoders is situated alongside said second substrate area of an adjacent one of said sub-word decoders.

13. The semiconductor device as claimed in claim 8, wherein said main-word lines are provided commonly for said plurality of column blocks.

14. The semiconductor memory device as claimed in claim 8, further comprising:
sub-word decoder control circuits, each outputting a control signal to corresponding one of said sub-word decoders in response to a sub-word decoder selection signal and a column block selection signal, wherein said sub-word decoders select the sub-word lines in response to said control signal.

15. The semiconductor memory device as claimed in claim 14, wherein said control signal is a complement signal comprising a first control signal and a second control signal, and one of said sub-word decoder comprising:
a first PMOS transistor coupled between said main-word line and said sub-word line and controlled by said first control signal;
a first NMOS transistor coupled between said sub-word line and a reference potential and controlled by said first control signal; and
a second PMOS transistor coupled between said main-word line and said sub-word line and controlled by said second control signal.

16. A semiconductor memory device having a hierarchical word line structure, comprising:
sub-word lines disposed in first and second column blocks;
sub-word decoders shared by said first and second column blocks and coupled to said sub-word lines;
first and second sense-amplifier blocks provided for said first and second column blocks, respectively; and
a column-block-selection circuit selecting the sub-word decoders and activating both of said first and second sense-amplifier blocks in response to a column block address signal designating either one of said first and second column blocks.

17. The semiconductor memory device as claimed in claim 16, wherein said column-block-selection circuit selects said first and second column blocks in response to said column block address signal and a sub-word line selection signal.

18. The semiconductor memory device as claimed in claim 16, wherein said column-block-selection circuit selects said first column block based on a predetermined number of bits extracted from a column block address signal, and selects said second column block based on said predetermined number of bits and said sub-word line selection signal.

19. The semiconductor memory device as claimed in claim 16, further comprising a row-block-selection circuit selecting one of a plurality of row blocks, wherein each of said row blocks including said first and second sense amplifier blocks.

20. The semiconductor memory device as claimed in claim 16, further comprising:
a sub-word-decoder selecting circuit which selects said sub-word decoders; and
sub-word-decoder-control circuits provided between said sub-word-decoder selecting circuit and said sub-word decoders,
wherein said sub-word-decoder-control circuits supply selection signals from said sub-word-decoder selecting circuit to said sub-word decoders in response to a column-block-selection signal from said column-block-selection circuit.

21. The semiconductor memory device as claimed in claim 16, wherein said sense-amplifier blocks in said first column block and said second column block receive a driving current from either side of a corresponding one of said sense-amplifier blocks.

22. The semiconductor memory device as claimed in claim 16, further comprising:
a column-address counter generating consecutive column addresses by counting up a column address; and
column-selection lines selecting an indicated column address,
wherein said sense-amplifier blocks are successively activated in accordance with successive selective activation of said column-selection lines as said column address is counted up.

23. The semiconductor memory device as claimed in claim 22, wherein when said column-selection lines are successively selected, a next one to be activated after a last one of said column-selection line is selectively activated is a first one of said column-selection line.

24. A semiconductor memory device comprising:
a plurality of main-word lines;
a main-word decoder which selects one of said plurality of main-word lines;
a plurality of column blocks arranged in a column direction and including memory cells;
sub-word lines provided for each one of said plurality of main-word lines;
sub-word decoders shared by at least two of said plurality of column blocks and coupled to said sub-word lines in said at least two of said plurality of column blocks;
sense-amplifier blocks provided for each one of said plurality of column blocks;
a column-block-selection circuit activating said sense-amplifier blocks in said at least two of said plurality of column blocks in response to a column block address signal designating either one of said at least two of said plurality of column blocks.

25. The semiconductor memory device as claimed in claim 24, wherein said column-block-selection circuit activates said sense-amplifier blocks in a first column block and at least one second column block based on said column block address signal and a sub-word line selection signal.

26. The semiconductor memory device as claimed in claim 25, wherein said column-block-selection circuit selects said first column block based on a predetermined number of bits extracted from said column block address signal, and selects said at least one second column block based on said predetermined number of bits and said sub-word line selection signal.

27. A semiconductor memory device having a hierarchical word line structure, comprising:
   sub-word lines provided for each one of column blocks;
   sub-word decoders shared by at least some column blocks and coupled to said sub-word lines in said at least some column blocks;
   sense-amplifier blocks provided for each of said column blocks; and
   a column-block-selection circuit selectively activating said sense-amplifier blocks only with respect to column blocks which share a selected one of said sub-word decoders.

* * * * *